United States Patent [19]

Grace

[11] 3,721,919

[45] March 20, 1973

[54] HIGH EFFICIENCY MODE PLANAR MICROCIRCUIT HIGH FREQUENCY SIGNAL GENERATOR

[75] Inventor: Martin I. Grace, Framingham, Mass.

[73] Assignee: Sperry Rand Corporation, New York, N.Y.

[22] Filed: March 13, 1972

[21] Appl. No.: 234,177

[52] U.S. Cl. ....................331/96, 331/99, 331/107 R, 333/73 S, 333/84 M

[51] Int. Cl. ..........................................H03b 7/14

[58] Field of Search ..........331/96, 99, 107 R, 107 G; 330/56; 333/73 S, 82 A, 84 M

[56] References Cited

UNITED STATES PATENTS

| | | | |
|---|---|---|---|
| 3,665,339 | 5/1972 | Liu | 331/96 X |
| 3,680,002 | 7/1972 | Quine | 331/96 |
| 3,662,294 | 5/1972 | Jacobs et al. | 333/73 S X |

*Primary Examiner*—Roy Lake
*Assistant Examiner*—Siegfried H. Grimm
*Attorney*—Howard P. Terry

[57] ABSTRACT

An active high-efficiency-mode semiconductor diode is coupled for the generation of oscillating high frequency electromagnetic fields in a planar transmission line network, the apparatus taking the form of a single port, high frequency oscillator device. Oscillations are sustained by time delayed triggering phenomenon within the TRAPATT semiconductor diode.

9 Claims, 9 Drawing Figures

HIGH EFFICIENCY MODE PLANAR MICROCIRCUIT HIGH FREQUENCY SIGNAL GENERATOR

BACKGROUND OF THE INVENTION

1. Field of the Invention

The invention pertains to planar high frequency transmission line semiconductor diode oscillators, and more particularly relates to means in such semiconductor energy converter devices for efficiently sustaining oscillations therein.

2. Description of the Prior Art

Prior art high-efficiency-mode diode oscillators have made beneficial use of time delayed triggering phenomenon for the generation of high frequency or microwave oscillations. The action of the time delayed triggering phenomenon in a conventional diode oscillator has been explained as follows. Where a short circuit is placed roughly a half wave distance at the mid-operating fundamental frequency from the diode, consider that a transient over-voltage sufficient in magnitude to initiate a traveling avalanche zone is placed across the diode. The over-voltage may be introduced when a suitable signal is deliberately coupled into the device. While the consequent avalanche zone travels across the depletion region of the diode, the voltage across the diode drops. When the avalanche zone front has completely crossed the diode, the instantaneous voltage on the diode is substantially zero. Accordingly, a short duration voltage pulse is generated at the diode whose magnitude is substantially equal to the diode break-down voltage. This short duration voltage pulse cannot do else than propagate down the transmission line in which the diode is connected. Upon reaching the effective short circuit placed substantially a half wave distance from the diode, the traveling pulse is inverted and is reflected to return to the diode with a total time delay of $\lambda/c$, where $c$ is the velocity of propagation within the transmission line. The delayed pulse instantaneously drives the voltage across the diode to about twice its break-down voltage, thus pretriggering another avalanche shock wave within the diode. Such an event permits the entire process repeatedly to cycle.

For high-efficiency-mode oscillators, time delayed triggering may beneficially be a major source of steady state oscillations. However, prior art oscillator circuits utilizing the phenomenon have not proved to be optimum in design. Many such coaxial or hollow wave guide circuits have proven to be difficult to make and to adjust at increasingly high carrier frequencies because of their small size. The problems associated with devising suitable means of independently matching, tuning, and otherwise adjusting the individual parts of the circuit in which fundamental and harmonic signals mutually or separately flow become increasingly difficult. Prior art oscillator circuits have not generally offered ease of tuning or of design for operation at a specific frequency. Past tuning arrangements have not assured optimum coupling in proper relative phase and amplitude of the fundamental and harmonic energies to the diode. Furthermore, the diode circuits, when pulse operated, have displayed a significantly excessive leading edge jitter.

SUMMARY OF THE INVENTION

The invention is a high frequency or microwave planar microcircuit diode oscillator device operating in a time delayed trigger mode transmission line network and employing a high-efficiency-mode active diode device. A unidirectional potential is applied across the high-efficiency-mode diode such that it is biased above the avalanche break down level. Any high frequency signal, when superimposed upon the bias potential, produces large changes in the instantaneous diode voltage and current, which changes are characteristic of time-delay-triggered oscillations. The consequent diode current wave contains many harmonic components of the fundamental oscillation frequency. The use of independent impedance adjustments at each harmonic produces an optimum current wave form, thereby improving the conversion efficiency of the diode. The frequency of the fundamental oscillation is largely determined by the electrical length of a shorted section of planar transmission line, offering essentially independent frequency adjustment. Substantially independent tuning of harmonics is also afforded.

DESCRIPTION OF THE PREFERRED EMBODIMENT

Figure 1:
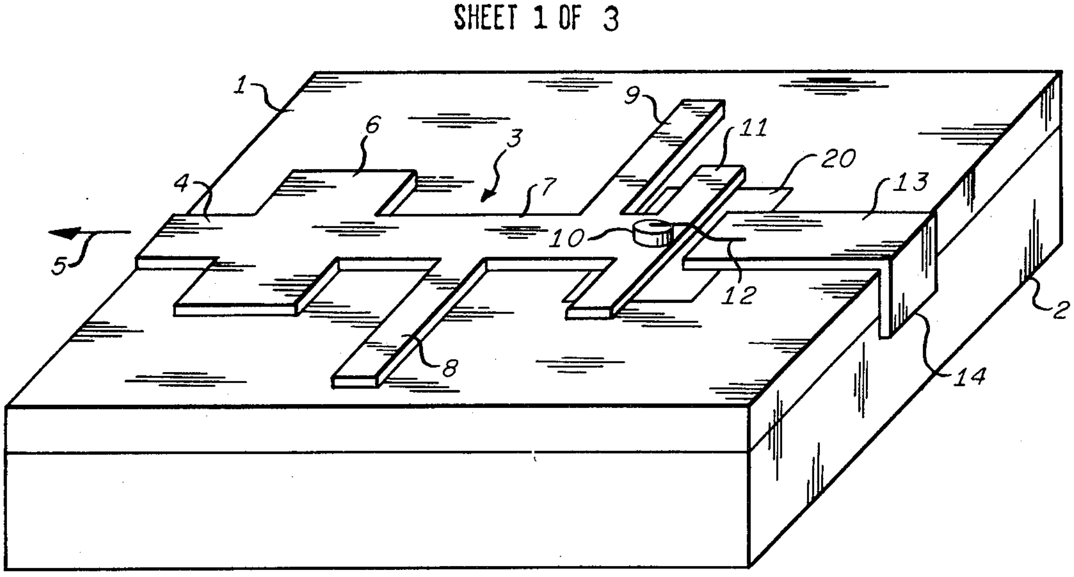
FIG. 1 is a perspective view of a preferred form of the invention.
Figure 2:
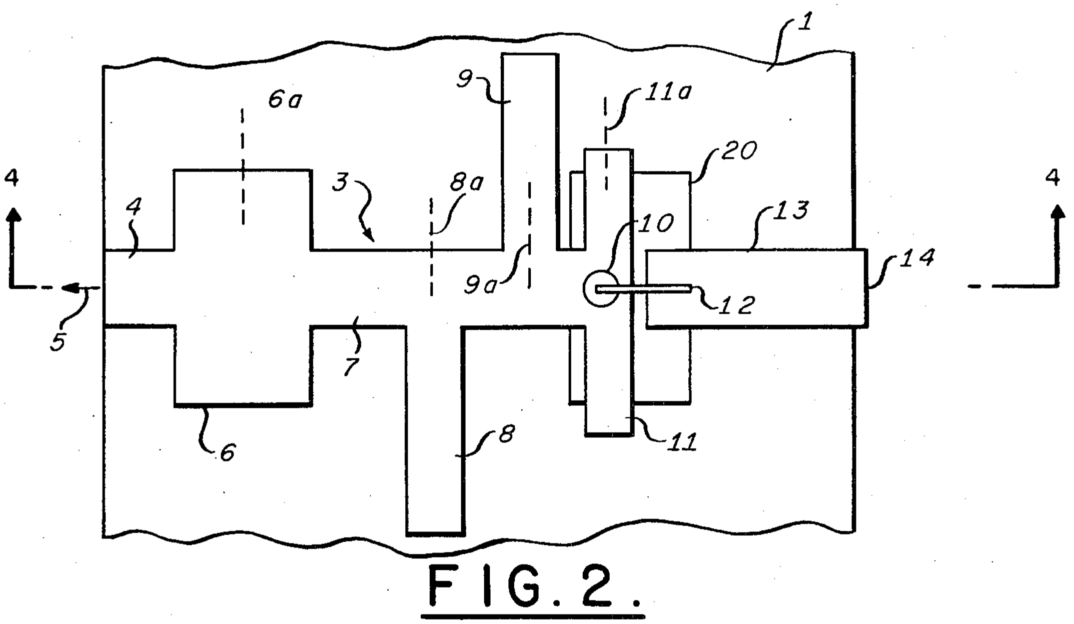
FIG. 2 is a plan view of the structure shown in FIG. 1.

Referring to FIGS. 1 and 2, the novel diode microcircuit high frequency oscillator is shown in planar transmission line form, the transmission line comprising at least a dielectric substrate 1, such as of an aluminum oxide or other ceramic, to one surface of which a relatively thick conductive ground and heat sink sheet 2 is bonded in well known manner. For example, sheet 2 may be formed on one surface of substrate 1 by evaporation in a vacuum chamber from an electrically heated source for distilling the desired metal, or by chemical electroplating or by other known plating methods. Sheet 2 may alternatively be built up in two steps, the first being a step of forming a thin portion of sheet 2 by vacuum distillation and the second being to increase greatly the thickness of the latter by electrodeposition of metal on the vacuum distilled layer.

The transmission line system 3 opposite ground plane 2 comprises planar or microstrip TEM mode circuit elements similarly formed and bonded to a second or upper surface of substrate 1. The transmission line system 3 may be formed in a conventional manner by evaporation of metal in a vacuum chamber through a suitable mask on to the free surface of substrate 1. A thin layer of chromium, for example, may first be evaporated through the mask on to the substrate surface, since chromium establishes an excellent bond with many dielectric materials. A relatively thick layer of gold may next be evaporated through the same mask, the gold layer forming a firm bond with the chromium layer, and affording a surface highly conducting for microwave currents. Silver or other good electrical conductors may be used in place of gold.

It will be understood that other processes may be employed for forming the transmission line system 3 on substrate 1. For example, the method described by R.M. Denhard in the U.S. Pat. No. 3,585,533, issued June 15, 1971 and assigned to the Sperry Rand Corporation may be employed. According to Denhard's method, a gold layer of the thickness required for transmission line system 3 is laid down on the substrate by vacuum distillation and a photographic process for forming a mask on the gold surface is then used. The undesired portion of the gold layer is etched away, exposing the substrate and leaving only the desired circuit when the mask is removed. It will also be understood that the proportions of parts in FIGS. 1 and 2 are somewhat exaggerated for the purpose of providing clarity in the drawings. It will additionally be understood that substrate 1 may be extended in selected directions in order to support additional active or passive microwave circuits as required in various applications.

The active part of the transmission line system 3 comprises a short section 4 of planar transmission line for supplying an output indicated by arrow 5 to utilization equipment adapted for connection to the oscillator. Adjacent output section 4 and centered about reference plane 6*a*, an impedance matching transformer 6 which may be of symmetric type is supplied that is one quarter of a wave long at the fundamental operating frequency $\omega_o$ of the oscillator.

A transmission line 7, preferably of the same impedance as output transmission line section 4, conductively joins transformer 6 to the oscillator diode 10 and supports the latter. Branching from one side of line 7 at reference plane 8*a* is an open circuited stub transmission line 8 which is one fourth of a wave long at the harmonic frequency $2\omega_o$. In a similar manner, but branching from the opposite side of transmission line 7 at reference plane 9*a*, is an open circuited stub transmission line 9 which is one fourth of a wave long at the harmonic frequency $3\omega_o$.

At the reference plane 11*a* in which diode 10 is found conductively attached to transmission line 7, line 7 is symmetrically expanded to form a capacitive coupling section 11 which couples the high frequency electric field through substrate 1 to ground plane 2. The diode 10 is connected between the face of line 7 and a conducting wire 12 which acts as an impedance to high frequency signals and is conductively joined to conductor 13. Conductor 13 is conveniently made the same width as line 7 and is connected at 14 to ground plane 2, thus forming a section of shorted transmission line.

Diode 10 may be a diode of the type known generally as the avalanche transit time diode. It may be used in the form known as the trapped plasma avalanche triggered transit diode, also known as the TRAPATT diode. For example, diode 10 may be an epitaxial silicon or other p-n or step or abrupt junction diode or a p-n-n+ or other punch-through diode designed such that, with an electric field of suitable amplitude present, the field punches through a substrate at reverse break down. Such diodes may, for example, be successfully formed by diffusing boron from a boron-nitride source into a phosphorous-doped epitaxial material on a heavily doped antimony substrate. The thickness of the epitaxial layer is varied by etching, prior to diffusion, so as to produce either the abrupt p-n structure or the p-n-n+ structure.

Figure 3:
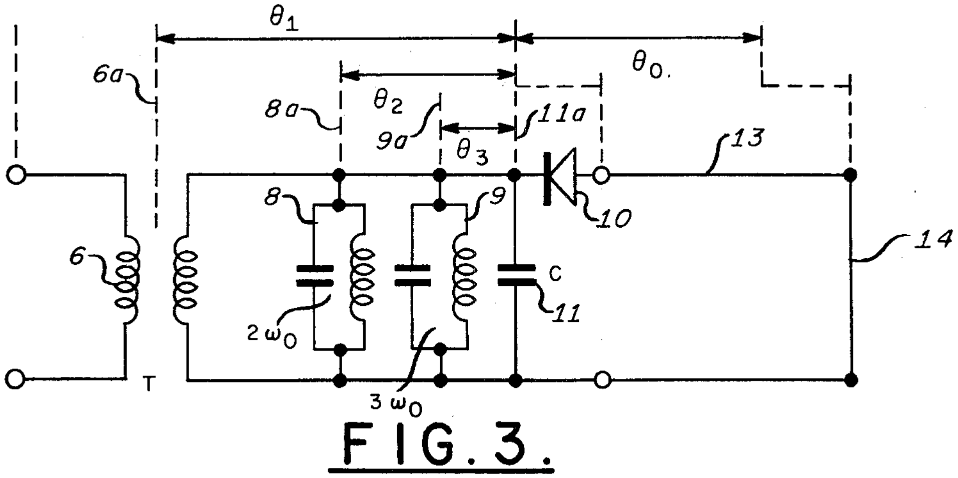
FIG. 3 is a circuit diagram useful for explaining the operation of the embodiment shown in FIGS. 1 and 2.

The general functions of the circuit elements of FIGS. 1 and 2 may be explained from the model shown in FIG. 3, though it must be observed that the model suffers because it cannot strictly represent the distributed circuit of FIGS. 1 and 2, especially over the whole of the regime of frequencies including the span of harmonic frequencies employed in the invention. Diode 10 is represented as being at the reference plane 11*a* of capacitor 11, and other elements are spoken of as located in relation to plane 11*a*. For example, the shunt resonant circuit 9 of FIG. 3, corresponding to stub 9 of FIGS. 1 and 2, is located at plane 9*a* at a distance $\theta_3$ from plane 11*a*. The magnitude of $\theta_3$ is such as to make diode 10 series resonant at harmonic $3\omega_o$. The shunt resonant circuit 8 of FIG. 3 corresponding to stub 8 of FIGS. 1 and 2, is located at plane 8*a* at a distance $\theta_2$ from plane 11*a*. The value of $\theta_2$ is such as to make diode 10 series resonant at harmonic frequency $2\omega_o$. The transformer 6 of FIG. 3 is located at distance $\theta_1$ from plane 11*a*, as is transformer 6 in FIGS. 1 and 2, the value of $\theta_1$ being adjusted to make diode 10 series resonant at the fundamental frequency $\omega_o$. Transformer 6 thus acts efficiently to couple signals of fundamental frequency $\omega_o$ out of transmission line section 4. The distance $\theta_0$ between reference plane 11*a* and short circuit 14 is made one half a wave length at the fundamental frequency $\omega_o$.

The power level of operation of the novel planar diode oscillator may be enhanced by incorporating a section 20 of dielectric material having high heat transfer capabilities within dielectric or substrate layer 1. While an aluminum oxide or other ceramic may be used for substrate 1, other known materials of excellent low loss characteristics and similar dielectric constants have greater heat transfer coefficients, and may therefore be used for the more effective transfer of heat from diode 10 into the combination ground plane heat sink 2. Insert 20 may be in the form of a diamond or beryllium oxide part suitably ground to fit within a rectangular hole ground in dielectric substrate 1. Insert 20 is placed, for example, in its position in substrate 1 and is permanently held there by the subsequent formation of ground plane 2 and of conductors 7 and 13.

Operation of the invention may best be understood by first referring to FIGS. 5 to 8 which represent related prior art arrangements. For example, the FIG. 5 model has often been employed in the past, in the study of high-efficiency-mode diode high frequency oscillators; it represents a convenient but general equivalent circuit model which has apparently successfully described many observed results. The FIG. 5 model has been found to have a degree of validity, even though it is a lumped constant model representing a device properly characterized by distributed parameters and operating in the presence of harmonics in a wide range of frequencies in a manner not strictly representable by a particular lumped constant configuration at all such participating frequencies.

Figures 4, 5:
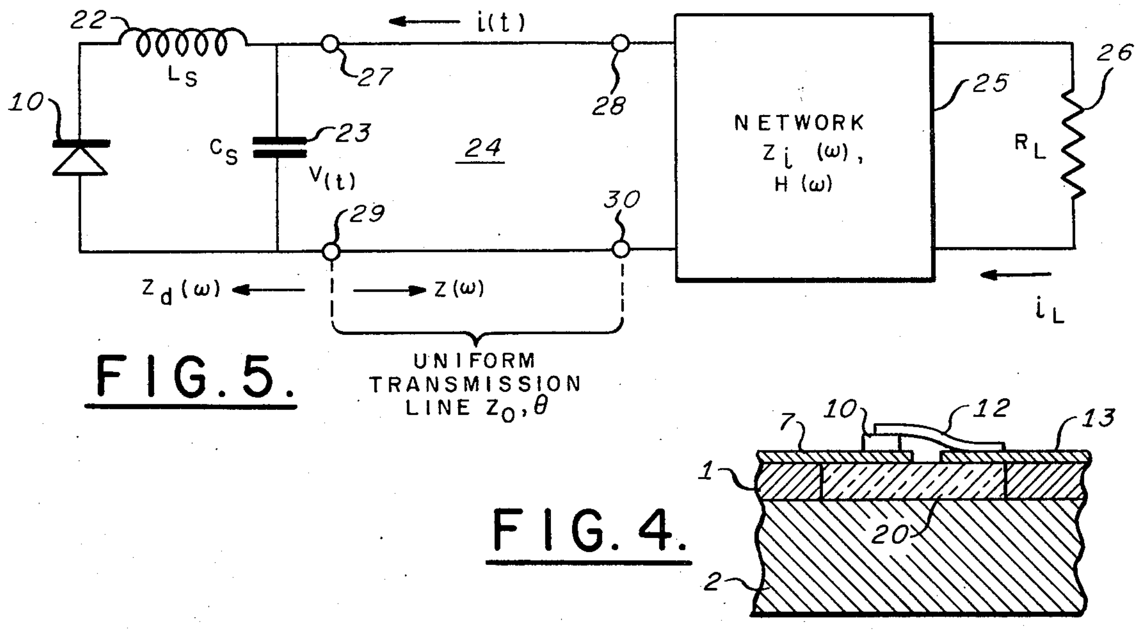
FIG. 4 is a cross section view of a part of FIGS. 1 and 2 taken along the line A—A of FIG. 2.
FIGS. 5 and 6 are circuit diagrams useful in explaining the operation of prior art diode devices.

The equivalent circuit model of FIG. 5 illustrates a high frequency oscillator diode package including a diode 10 having package parasitics including a series lead inductance 22 of value $L_s$ and a shunt package capacitance of value $C_s$. Looking to the right in the figure from the diode package terminals 27 and 29, the basic circuit of the oscillator is composed of a section of uniform transmission line 24 ending at a plane containing terminals 28 and 30 where it is connected in cascade with microwave filter network 25 and a load 26 of value $R_L$. The section of uniform transmission line 24 is characterized by an electrical length $\theta$ and a characteristic impedance $Z_0$. Filter network 25 is characterized by an input impedance $Z_i(\omega)$ and a filter transfer function $H(\omega)$. The diode terminal impedance $Z_D(\omega)$, including effects of the diode parasitic series lead inductance $L_s$ and shunt capacitance $C_s$, may be described by the equation:

$$Z_D(\omega) = R_D(\omega) + jX_D(\omega)$$

where $R_D$ is the resistive part of the impedance of diode 10 and $X_D$ is the reactive part.

In the operation of high efficiency mode oscillators, the current at the diode terminals 27, 29 has normally been a train of relatively short duration pulses rich in harmonic energy; accordingly, the pulsed current wave contains a component of fundamental frequency $\omega_f$ and effectively all of its harmonic spectral components $n\omega_f$, where $n = 2, 3, 4, \ldots, n$. In order to support in substantial individual amplitude this plurality of frequency components across diode 10, the circuit-diode combination of FIG. 5 must be resonant at the fundamental frequency $\omega_f$ and effectively at all harmonic frequencies $n\omega_f$, as well. In other words, the reactive part of the input impedance $Z_\omega$ must be the conjugate of the diode reactance $X_D(\omega)$, where $n = 1, 2, 3, \ldots, n$.

It has been recognized that certain significant constraints must be placed upon the arbitrary FIG. 5 circuit model. Since it is generally desired of an oscillator that it produce an output signal of a predetermined single frequency, uncluttered by harmonics or other spurious signals, it is seen that the filter network 25 must efficiently pass the fundamental frequency $\omega_f$ to the utilization circuit 26, while successfully retaining all harmonic frequencies $n\omega_f$. In addition to retaining the harmonic energy, the filter circuit 26 must be of such a nature that the harmonics are not dissipated, otherwise the direct current-to-high frequency current conversion efficiency of the oscillator will be unsatisfactorily low. Thus, the real parts of the input impedance of filter 25 at each harmonic frequency must approach zero ohms.

In summary, these circuit characteristics may be realized by a properly selected low-pass filter or harmonic choke system; in any event, the real part of $Z(\omega_f)$ must equal the absolute value of the real part of $Z_D(\omega_f)$. Also, the real value of $Z(n\omega_f)$ must approach zero for $n = 2, 3, 4, \ldots, n$. Further, the imaginary part of $Z(n\omega_f)$ must equal the negative value of the imaginary part of $Z_D(n\omega_f)$ for $n = 1, 2, 3, 4, \ldots, n$. The transfer function $H(n\omega_f)$ must be unity for $n = 1$ and must be zero for $n = 2, 3, 4, \ldots, n$.

High efficiency mode diode, high frequency oscillators have often been operated by use of time-delayed triggering. The fundamental character of time-delayed triggering of such oscillators is that they employ a network 25 such as modeled in FIG. 5. As in FIG. 6, the network may be located an electrical distance $\lambda/2$ from diode 10, $\lambda$ corresponding to the fundamental or output frequency $\omega_0$. Such also defines a criterion necessary for operation by time-delayed triggering, a phenomenon found in certain semiconductor diodes. As previously noted, a diode of the type known generally as the avalanche transit time diode is found to have characteristics suitable for use as diode 10.

Figure 6:
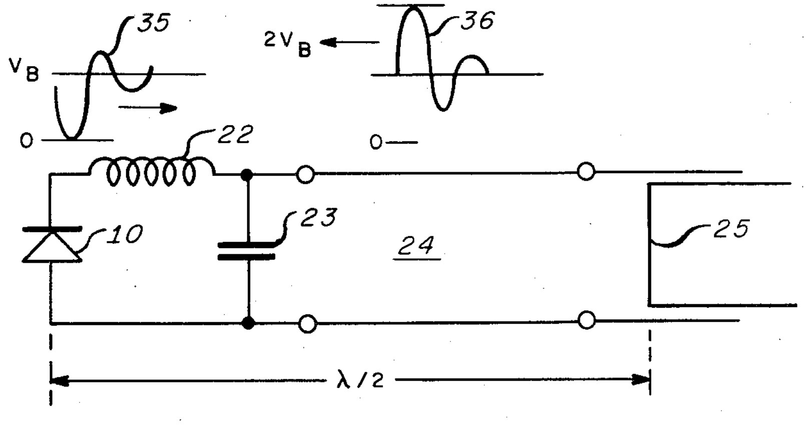
Figure 7:
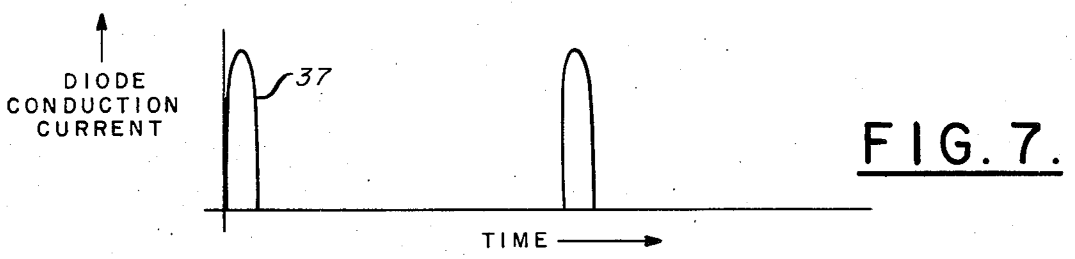
FIGS. 7 and 8 are signal wave forms useful in explaining operation of the invention.

In FIG. 6, the network represented by element 25 is placed an electrical distance $\lambda/2$ at frequency $\omega_0$ from diode 10. If a sufficiently large transient over-voltage 37, as in FIG. 7, is applied across TRAPATT diode 10, a traveling avalanche zone is initiated within the diode. During the time the zone passes across the depletion layer of diode 10, the diode voltage drops and the current through diode 10 sharply increases. When the avalanche shock front has completely traversed the depletion layer of diode 10, the diode voltage instantaneously drops to very nearly zero. Accordingly, a voltage step wave 35 whose magnitude is greater than the diode break down voltage is generated.

Figure 8:
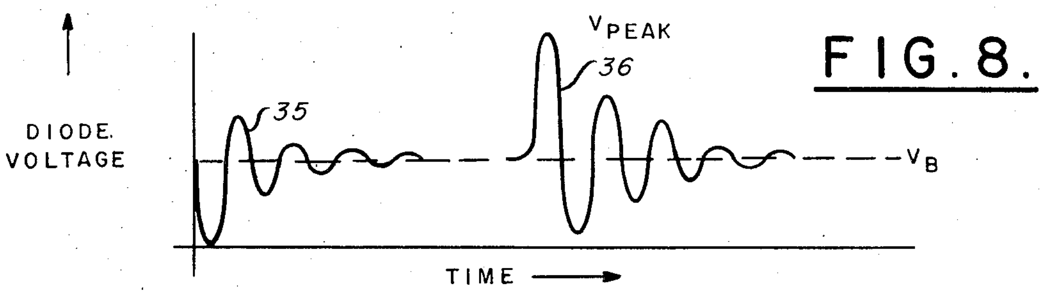

The generated step wave 35 then propagates along the $\lambda/2$ transmission line path from diode 10 to filter 25, whose high frequency impedance is very nearly that of a short circuit. At filter 25, the step voltage wave is reflected as a wave 36 having almost the same amplitude as wave 35, but being inverted in polarity (FIG. 8). The reflected step wave arrives back at diode 10 with a total time delay corresponding to one cycle at the fundamental frequency $\omega_0$. The diode 10 voltage is then automatically driven at the instant of arrival to approximately twice its break down voltage and a new avalanche is triggered in diode 10. The entire process cyclically repeats itself and is self-sustaining.

The novel planar microstrip oscillator shown in FIGS. 1 and 2 represents an improvement over prior art forms discussed in connection with FIGS. 5 and 6. It satisfies all of the elementary requirements for high efficiency mode operation as established in connection with FIGS. 5 and 6 and additionally offers many advantages including ease of design for operation at a specific desired frequency and of ready fabrication. The device of FIGS. 1 and 2 utilizes a TRAPATT diode 10 placed in series with the planar conductors 3 and 13 of the transmission line. To the right of the anode of diode 10 is located a section 13 of planar microstrip transmission line of electrical length $\theta_0$ terminated by short circuit 14. To the left of diode 10, between its cathode and the resistive load coupled to line section 4, are coupled the two harmonic tuning stubs 8 and 9 plus the quarter wave transformer 6. The lumped capacitor 11 physically supports diode 10 and participates in the removal of heat from diode 10 to the heat sink ground plane 2 through heat conducting insert 20.

As seen with the aid of the equivalent circuit of FIG. 3, the section 13 of planar transmission line to the right of diode 10 is chosen so that the effective electrical length $\theta_0$ from diode 10 to short circuit 14 is equal to $\lambda_o/2$, where $\lambda_o$ relates to the fundamental operating frequency. This section 13 of the transmission line supplies the desired propagation delay necessary for operation of time delayed triggering.

The shunt stubs 8 and 9 are open circuited and present a short circuit in shunt with planar conductor 3 at the desired frequencies. The third harmonic stub 9 is geometrically closest to diode 10, being placed an effective electrical distance $\theta_1$ from the anode of diode 10. Accordingly, the reactance of the shortest section 13 of the transmission line resonates with the net diode reactance at the third harmonic frequency. The second harmonic stub 8 is located an effective electrical length $\theta_2$ from the cathode of diode 10 such that the reactance consequently presented by the effective short circuit in the second harmonic stub 8 and third harmonic stub 9 resonate with the net diode reactance at the second harmonic.

The effective short circuit consequently provided at the harmonic frequencies by stubs 8, 9 confines all the harmonic current flow to the region of diode 10 and prevents harmonic power from being lost in dissipation in the load attached at line section 4. The transmission line 12, 13 coupled to the anode of diode 10 presents only a moderate impedance to all harmonics higher than $3f_o$, so that the energy of such harmonics is conductively shunted to ground plate 2.

The quarter wave transformer 6 is chosen to present a substantially matching load impedance to diode 10 such that maximum energy conversion efficiency and maximum power output at the fundamental frequency $\omega_o$ are obtained. At the harmonic frequencies $2\omega_o$, $3\omega_o$, . . . , $n\omega_o$, the stubs 8, 9 present a low impedance to diode 10 and the circuit behaves essentially like that of FIG. 5 with the input impedance $Z_i(n\omega_o) = 0$, where $n = 2, 3, \ldots, n$. All harmonic currents flow through diode 10 to provide the required high efficiency mode current wave shape.

As is above noted, a suitable unidirectional bias voltage must be supplied across diode 10. This may be accomplished in an entirely conventional manner by using an external adjustable voltage source in a circuit including inductive means for prevention of the flow of high frequency currents into the battery or source circuit, together with a capacitive coupling in the output transmission line for coupling the high frequency output into utilization means while preventing the flow of battery current along the output transmission line into the utilization apparatus.

Figure 9:
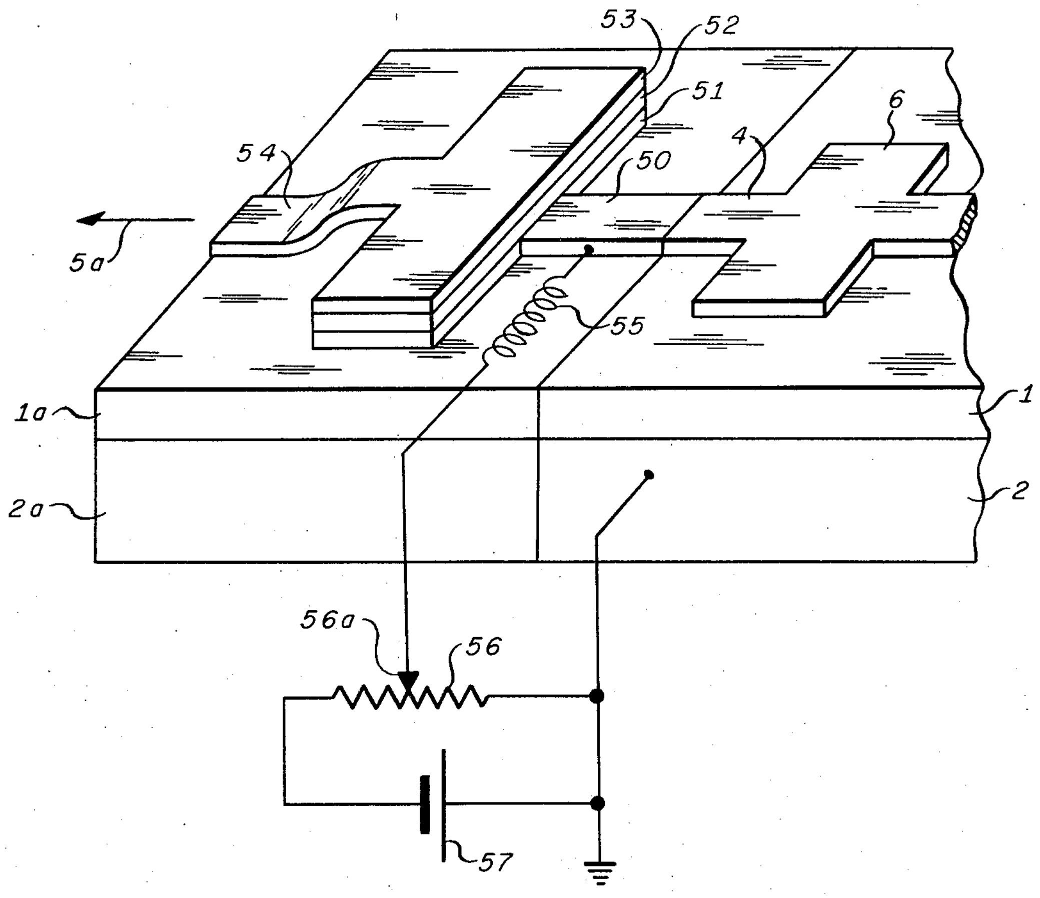
FIG. 9 is a partial perspective view of diode biasing elements which may be used with the oscillator of FIGS. 1 and 2.

One suitable bias supply for diode 10 is shown in FIG. 9 attached to the output line section 4 of the oscillator of FIGS. 1, 2, the arrangement including an extension 1*a*, 2*a* of the substrate 1 and ground plane element 2 of FIG. 1. The output line section 4 of the oscillator is extended in the form of planar conductor 50. Conductor 50 is capacity coupled to the final output section 54 through the high frequency coupling capacitor including plates 51 and 53 and dielectric sheet 52. The transmission line 50 is also coupled to inductive element 55 which, in turn, is coupled to the tap 56*a* of a potentiometer 56 placed across battery or other electrical source 57. One side of each of elements 56 and 57 is grounded and is also conductively coupled to ground plane 2. It is seen that the biasing current is supplied through inductor 55, conductor 50, and conductors 4, 6, and 3 through diode 10, wire 12, and conductors 13 and 14 to ground plane 2 and thence back to battery 57 in the conventional manner. It will be appreciated that the bias supply illustrated in FIG. 9 is merely representative of suitable supplies which are available in the prior art and that other choices may be successfully made.

It is seen that the invention is a planar diode oscillator or pulse generator of improved design. The fundamental operating frequency of the device is mainly determined by the $\lambda_o/2$ transmission line section 13 as closed by shorting connection 14, so that the fundamental frequency is essentially independently selectable. The novel oscillator provides pulsed operation with the leading edge jitter being much less than in conventional time delay triggered oscillators of the type discussed in connection with FIGS. 5 and 6. For example, pulse jitter may be reduced from values as great as ±25 nano-seconds to less than ±5 nanoseconds. It will be appreciated, of course, that best results are attained by using materials that are highly conducting for high frequency currents wherever the material forming the structures is exposed to high frequency fields. The harmonic stubs 8, 9 offer the advantage of being easily designed and set for optimum performance. The individual harmonic stubs also allow independent harmonic tuning, providing improved control over the high efficiency mode wave shape flowing in diode 10.

While the invention has been described in its preferred embodiment, it is to be understood that the words which have been used are words of description rather than of limitation and that changes within the purview of the appended claims may be made without departure from the true scope and spirit of the invention in its broader aspects.

I claim:

1. A high frequency planar microcircuit oscillator comprising:

ground plate heat sink means, dielectric sheet means bonded to said ground plate means, planar conductive circuit means having first and second transmission line sections bonded to said dielectric sheet means opposite said ground plate means, said first transmission line section having conductive coupling means coupled to said ground plate means, said second transmission line section including capacitor plate means capacitively coupled through said dielectric sheet means to said ground plate means, diode means conductively supported on said capacitor plate means and conductively coupled to said first transmission line section substantially at an electrical distance one half wave length at the fundamental operation frequency of said oscillator from said first transmission line section conductive coupling means coupled to said ground plate means, first stub transmission line means branching from said second transmission line section spaced from said diode means for series resonating said diode means at the third harmonic of said fundamental frequency, second stub transmission line means branching from said second transmission line section spaced from said first transmission line means and from said diode means for series resonating said diode means at the second harmonic of said fundamental frequency, and impedance matching transformer means branching from said second transmission line section and spaced from said first and second branching stub transmission line means for matching said oscillator to utilization means for efficient transfer of signals of said fundamental frequency thereto.

2. Apparatus as described in claim 1 wherein at least a portion of said dielectric sheet means beneath said capacitor plate means and said diode means comprises diamond for conveying heat from said diode means to said ground plate heat sink means.

3. Apparatus as described in claim 1 wherein at least a portion of said dielectric sheet means beneath said capacitor plate means and said diode means comprises beryllium oxide for conveying heat from said diode means to said ground plate heat sink means.

4. Apparatus as described in claim 1 wherein said diode means comprises trapped plasma triggered transit diode means.

5. Apparatus as described in claim 1 wherein said first stub transmission line means is bonded to said dielectric sheet means and projects from said second transmission line section adjacent said capacitor plate means.

6. Apparatus as described in claim 5 wherein said second stub transmission line means is bonded to said dielectric sheet means and projects from said second transmission line section adjacent said first stub transmission line means opposite said capacitor plate means.

7. Apparatus as described in claim 6 wherein said impedance matching transformer means comprises an enlarged portion of said second transmission line section of length equal to one quarter wave at said fundamental frequency in the direction of energy propagation.

8. Apparatus as described in claim 7 wherein said first and second stub transmission line means branch in opposite directions from said second transmission line section.

9. Apparatus as described in claim 1 including means connected to said second transmission line section and to said ground plate means for supply of bias current through said diode means.

* * * * *